United States Patent
Lincheneau et al.

(10) Patent No.: US 12,514,048 B2
(45) Date of Patent: Dec. 30, 2025

(54) OPTOELECTRONIC DEVICE MANUFACTURING METHOD

(71) Applicant: Aledia, Champagnier (FR)

(72) Inventors: Christophe Lincheneau, Moirans (FR); Ivan-Christophe Robin, Grenoble (FR)

(73) Assignee: Aledia, Champagnier (FR)

( * ) Notice: Subject to any disclaimer, the term of this patent is extended or adjusted under 35 U.S.C. 154(b) by 0 days.

(21) Appl. No.: 18/989,552

(22) Filed: Dec. 20, 2024

(65) Prior Publication Data

US 2025/0212580 A1 Jun. 26, 2025

(30) Foreign Application Priority Data

Dec. 26, 2023 (FR) ..................... 2315318

(51) Int. Cl.
| | |
|---|---|
| *H10H 29/01* | (2025.01) |
| *H01L 25/075* | (2006.01) |
| *H01L 25/16* | (2023.01) |
| *H10H 29/80* | (2025.01) |

(52) U.S. Cl.
CPC ..... *H10H 29/0361* (2025.01); *H01L 25/0753* (2013.01); *H01L 25/167* (2013.01); *H10H 29/012* (2025.01); *H10H 29/942* (2025.01)

(58) Field of Classification Search
CPC .. H10H 29/0361; H10H 29/857; H10H 29/34; H10H 29/8513; H10H 29/8516; H10H 20/8132; H10H 20/8133; H10H 29/842; H10H 20/819; H10H 29/02; H10H 29/0364; H01L 25/0753; H01L 25/167
See application file for complete search history.

(56) References Cited

U.S. PATENT DOCUMENTS

| | | | |
|---|---|---|---|
| 2019/0278171 A1* | 9/2019 | Tiron | G03F 7/0048 |
| 2019/0371779 A1 | 12/2019 | Yeon et al. | |
| 2020/0194417 A1 | 6/2020 | Yeon et al. | |
| 2021/0020619 A1 | 1/2021 | Iguchi et al. | |
| 2021/0135064 A1 | 5/2021 | Ishio | |
| 2021/0336095 A1 | 10/2021 | Chen et al. | |
| 2021/0399260 A1* | 12/2021 | Kim | H10K 59/8731 |
| 2022/0406628 A1* | 12/2022 | Mayer | H01L 21/6835 |

FOREIGN PATENT DOCUMENTS

| | | |
|---|---|---|
| CN | 109791939 A | 5/2019 |
| CN | 110556455 A | 12/2019 |
| CN | 112242468 A | 1/2021 |
| CN | 112748609 A | 5/2021 |
| JP | 2021019015 A | 2/2021 |
| JP | 2021071645 A | 5/2021 |
| KR | 20190137458 A | 12/2019 |
| WO | WO 2020/073305 A1 | 4/2020 |

OTHER PUBLICATIONS

Preliminary Search Report for French Application No. 2315318, dated Aug. 21, 2024.

* cited by examiner

*Primary Examiner* — Ratisha Mehta
(74) *Attorney, Agent, or Firm* — Wolf, Greenfield & Sacks, P.C.

(57) ABSTRACT

A method of manufacturing an optoelectronic device including the steps of manufacturing of the display pixel circuits, each comprising an emission surface, and on the surface, walls delimiting at least one cavity, of bonding of the display pixel circuits to a support, and of filling of the at least one cavity of each display pixel circuit with a first filling material to form a first color conversion module in the cavity.

13 Claims, 5 Drawing Sheets

OPTOELECTRONIC DEVICE MANUFACTURING METHOD

CROSS REFERENCE TO RELATED APPLICATIONS

This application claims priority to French application number 2315318, filed Dec. 26, 2023. The contents of which is incorporated by reference in its entirety.

TECHNICAL FIELD

The present application concerns a method of manufacturing an optoelectronic device, in particular a display screen or an image projection device, comprising color conversion modules.

PRIOR ART

A pixel of an image corresponds to the unit element of the image displayed or captured by an optoelectronic device. There is called display pixel of the optoelectronic device the element of the optoelectronic device allowing the displaying of an image pixel. A display pixel of an optoelectronic device such as a color image display screen or a color image projection device generally comprises for the display of an image pixel at least three components, called display sub-pixels, which each emit light radiation substantially in a single color (for example, red, green, and blue). The superimposition of the radiation emitted by the display sub-pixels provides the observer with the colored sensation corresponding to the image pixel of the displayed image.

A display sub-pixel may comprise a light source, in particular a light-emitting diode, covered by a color conversion module, for example in the form of a photoluminescent block. The photoluminescent block comprises luminophores or particles of at least one photoluminescent material configured, when they are excited by the light emitted by the associated light-emitting diode, to emit light at a wavelength different from the wavelength of the light emitted by the associated light-emitting diode. Photoluminescent particles can appear in the form of quantum dots.

Walls surrounding sub-pixels comprising or not comprising color conversion modules and which reflect or absorb the radiation emitted by the light-emitting diodes but also by the color conversion modules, may be provided. The walls thus decrease the crosstalk between adjacent sub-pixels. Another advantage of walls is to be used as of means confinement for the deposition of the materials forming up the color conversion modules.

An example of a method of manufacturing an optoelectronic device, in particular a display screen, comprises the manufacturing of display pixels on a semiconductor wafer, the cutting of the wafer to separate the display pixels, and the transfer and the bonding of the display pixels onto a support of the display screen. A disadvantage is that methods of cutting display pixels and/or of transferring display pixels from the wafer onto the substrate and/or of bonding the display pixels to the support may require high-energy steps and/or temperatures higher than 200° C., and that the optical conversion properties of the color conversion modules may degrade during these steps. The thermal balance of the method of manufacturing the display pixels and/or of bonding the display pixels to the substrate can be all the more unfavorable for the color conversion modules when the display pixel corresponds to a smart pixel, that is, when it comprises an electronic circuit for controlling the light-emitting sources of the display sub-pixels.

SUMMARY OF THE INVENTION

An embodiment overcomes all or part of the disadvantages of known optoelectronic devices comprising color conversion modules.

An embodiment provides a method of manufacturing an optoelectronic device comprising the following steps, in the order:

a) manufacturing display pixel circuits, each comprising an emission surface, and on the surface, walls delimiting at least one cavity;

b) bonding the display pixel circuits to a support; and c) filling the at least one cavity of each display pixel circuit with a first filling material to form a first color conversion module in the cavity.

The walls which surround the first color conversion modules advantageously enable to decrease the optical crosstalk between adjacent display sub-pixels of the display pixel circuit. The fact of forming the first color conversion modules after the placing of the display pixel circuits on the support advantageously enables to select the first filling material to be used at a late step in the manufacturing of the optoelectronic device. Another advantage of forming the first color conversion modules after the placing of the display pixel circuits on the support is that the first color conversion modules are not exposed to high temperatures that may be present in particular on bonding of the display pixel circuits to the support. Another advantage of forming the first color conversion modules after the placing of the display pixel circuits on the support is that it is not necessary to provide a protection of the first color conversion modules, which would be necessary if the first color conversion modules were formed before the separation of the display pixel circuits or, more generally, before the placing of the display pixel circuits on the support.

An advantage of forming the walls before the step of transfer of the display pixel circuits onto the support is that it makes the forming of the walls by manufacturing steps comprising photolithography steps easier, since the display pixel circuits have not undergone a transfer yet and are thus correctly aligned on the wafer. Indeed, the transfer induces potential misalignments or positioning rotations, which make the implementation of photolithography steps to form the walls impossible, complex, or imprecise, since multiple degrees of error have to be taken into account.

According to an embodiment, the first filling material comprises quantum dots. Since the optical conversion properties of quantum dots may degrade when the quantum dots are exposed to high temperatures, the fact of forming the first color conversion modules after the placing of the display pixel circuits on the support advantageously enables to avoid exposing the quantum dots to high temperatures.

According to an embodiment, the method comprises, after step c), the step of forming of a protective film completely covering each display pixel circuit and the support between the display pixel circuits. The film may advantageously be water- and oxygen-tight to protect the first color conversion modules. The film may advantageously be simply deposited over the entire optoelectronic device just after the deposition of the color conversion modules, and thus avoid damage thereto.

According to an embodiment, step a) comprises the forming of a plurality of copies of the display pixel circuit on a wafer and the cutting of the wafer to separate the display pixel circuits. This advantageously enables to form the walls by using conventional manufacturing technologies of microelectronics.

According to an embodiment, at step a), the forming of the walls comprises photolithography steps. This advantageously enables to form walls having a thickness that may be in order of one micrometer or lower than one micrometer. Advantageously, identical photolithography steps may be implemented while the display pixel circuits may be intended for different electronic devices, for example for different types of display screens. In particular, the same masks may be used to form the walls of the display pixel circuits, even though the display pixel circuits may be intended for different electronic devices.

According to an embodiment, the method comprises, at step a), the filling of the cavities with a second filling material and, after step b) and before step c), the removal of the second filling material from the cavities. This advantageously enables to obtain temporary blocks in the cavities, which enable to consolidate the cavities for subsequent steps of the manufacturing method. The presence of the temporary blocks in the cavities further advantageously allows the obtaining of a display pixel circuit having a planar upper surface, which facilitates the use of a gripper for the transfer of the display pixel circuits from the wafer to the support.

According to an embodiment, at step c), the filling of the at least one cavity of each display pixel circuit with the first filling material is carried out by inkjet printing, by aerosol jet printing, or by extrusion printing. Advantageously, the cavity filling methods are adapted to compensating for deviations between the actual position and/or orientation of the display pixel circuits and the desired ideal position and/or orientation. This would not be the case with wall manufacturing methods if the walls were manufactured after the transfer of the display pixel circuits onto the support.

According to an embodiment, at step a), the walls delimit at least three cavities for each display pixel circuit.

According to an embodiment, the walls delimit at least two cavities for each display pixel circuit, and step c) comprises the filling of at least one of the cavities of each display pixel circuit with a third filling material, different from the first filling material, to form a second color conversion module in the cavity.

According to an embodiment, the ratio of the height to the thickness of the walls is in the range from 0.5 to 50.

According to an embodiment, the method comprises, at step a), the forming of light-emitting diodes for each display pixel circuit.

According to an embodiment, the support comprises a slab provided with electrical connection tracks, the method comprising, at step b), the transfer of the display pixel circuits onto the slab, the display pixel circuits being bonded to the electrical connection tracks, the pitch between the display pixel circuits on the slab being different from the pitch between the display pixel circuits on the slab.

According to an embodiment, the optoelectronic device is a display screen.

An embodiment also provides a display screen obtained by the previously-described manufacturing method.

BRIEF DESCRIPTION OF THE DRAWINGS

The foregoing features and advantages, as well as others, will be described in detail in the rest of the disclosure of specific embodiments given as an illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For clarity, only those steps and elements which are useful to the understanding of the described embodiments have been shown and are described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, where reference is made to absolute position qualifiers, such as "front", "back", "top", "bottom", "left", "right", etc., or relative position qualifiers, such as "top", "bottom", "upper", "lower", etc., or orientation qualifiers, such as "horizontal", "vertical", etc., reference is made unless otherwise specified to the orientation of the drawings or to a display pixel in a normal position of use.

Unless specified otherwise, the expressions "about", "approximately", "substantially", and "in the order of" signify plus or minus 10%, preferably of plus or minus 5%.

The transmittance of a layer corresponds to the ratio of the intensity of the radiation coming out of the layer via an exit surface to the intensity of the radiation entering the layer via an entry surface opposite to the exit surface. In the rest of the disclosure, a layer or a film is said to be opaque to radiation when the transmittance of the radiation through the layer or the film is lower than 10%. In the rest of the disclosure, a layer or a film is said to be transparent to radiation when the transmittance of the radiation through the layer or the film is greater than 10%.

In the rest of the disclosure, a film or a layer is said to be water-tight when the permeability of the film or of the layer to water at 40° C. is lower than $1.10^{-1}$ g/(m$^2$*day). The permeability to water can be measured according to the ASTM F1249 method entitled "Standard Test Method for Water Vapor Transmission Rate Through Plastic Film and Sheeting Using a Modulated Infrared Sensor".

Figure 1:
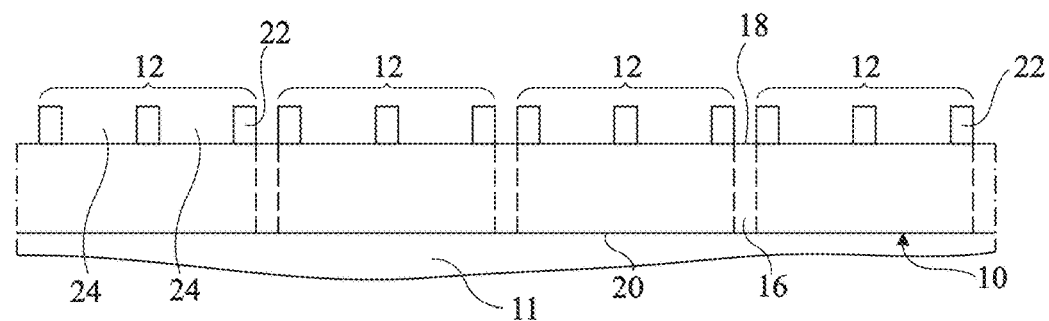
FIG. 1 and FIG. 2 are respectively a side cross-section view and a top view, partial and simplified, of a structure obtained at a step of a method of manufacturing a display screen.
Figure 2:
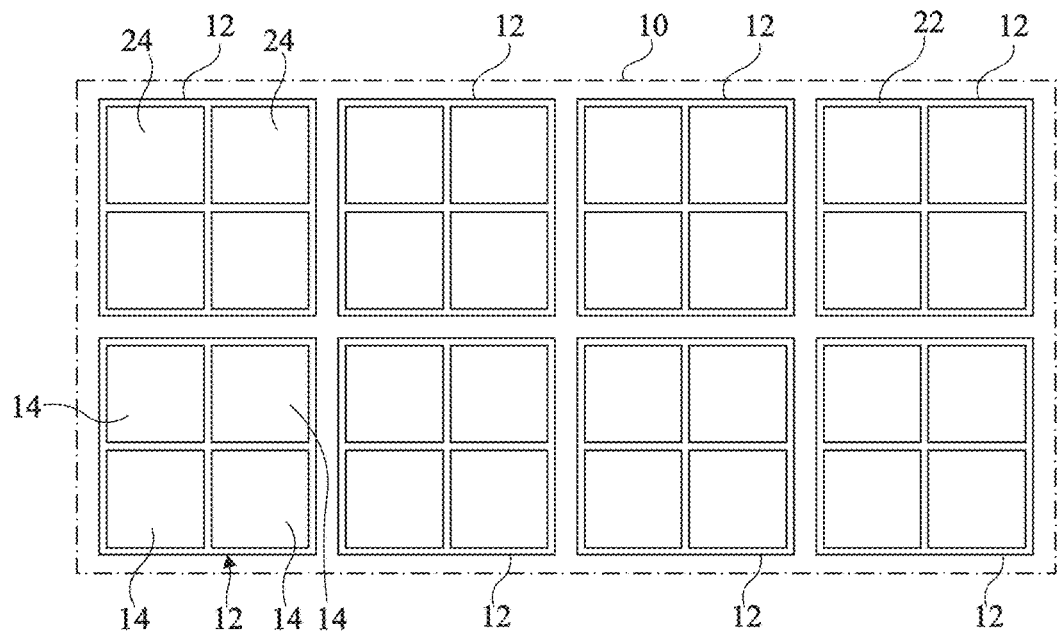

FIG. 1 and FIG. 2 are respectively a side cross-section view and a top view, partial and simplified, of a structure obtained at a step of an embodiment of a method of manufacturing an optoelectronic device corresponding to a display screen.

According to an embodiment, the method comprises the forming on a semiconductor wafer 10 of a plurality of copies of a display pixel 12, also called display pixel circuit, for a display screen. Wafer 10 may rest on a support 11. As an example, in FIG. 1, four copies of display pixel 12 are shown and, in FIG. 2, eight copies of display pixel 12 are shown. Each display pixel 12 comprises a plurality of display sub-pixels 14, for example three or four display sub-pixels 14. As an example, as shown in FIG. 2, each display pixel 12 comprises four display sub-pixels 14. Each display sub-pixel 14 comprises a light source, not shown, for example a light-emitting diode. According to an embodiment, in top view, each display pixel 12 is inscribed within a square having its side measuring from 4 µm to 2 mm. According to an embodiment, in top view, each display sub-pixel 14 is inscribed within a square having its side measuring from 2 µm to 1.5 mm.

Wafer 10 comprises a main structure 16 having an upper surface 18 and a lower surface 20 opposite to upper surface 18. According to an embodiment, surfaces 18 and 20 are parallel. According to another embodiment, surfaces 18 and 20 are planar. Wafer 10 comprises, for each display pixel, walls 22 which project from upper surface 18 and delimit a cavity 24 for each display sub-pixel 14. For at least some display sub-pixels 14, the cavity 24 of the display sub-pixel 14 is intended to receive, for example, a color conversion module, for example a photoluminescent block as will be described hereafter. Walls 22 are at least partly made of a material reflecting or absorbing the radiation emitted by the light sources and the photoluminescent blocks of display pixel 12.

According to an embodiment, walls 22 may be made of a reflective material or of a material coated with a coating reflective at the wavelength of the radiation emitted by the photoluminescent blocks and/or the light-emitting diodes. The reflective material may be a metallic material, in particular iron, copper, aluminum, tungsten, silver, titanium, hafnium, zirconium, or a combination of at least two of these compounds. Preferably, walls 22 are made of a material compatible with the manufacturing methods implemented in microelectronics.

According to an embodiment, the height of walls 22 measured relative to surface 18 is in the range from 300 nm to 200 µm, preferably from 1 µm to 50 µm. According to an embodiment, the thickness of walls 22, measured in a direction parallel to surface 18, is in the range from 100 nm to 50 µm, preferably from 0.1 µm to 50 µm. According to an embodiment, the aspect ratio of walls 22, that is, the ratio of the height to the thickness of walls 22, is in the range from 0.5 to 20.

According to an embodiment, the manufacturing of display pixels 12 on wafer 10 implements conventional techniques of microelectronics. In particular, according to an embodiment, walls 22 are manufactured by conventional deposition and etching techniques of microelectronics, comprising in particular photolithography steps. This advantageously enables to form walls 22 having a thickness in the order of one micrometer or smaller than one micrometer.

According to an embodiment, the manufacturing of walls 22 comprises the deposition of a layer of the material forming the core of the walls all over wafer 16 and the etching of this layer, for example a dry etching, to delimit walls 22. According to an embodiment, the manufacturing of walls 22 comprises the deposition of a resin layer on wafer 16, the forming of openings in the resin layer at the desired locations for walls 22, the deposition of the material forming the core of walls 22 into the openings, and the removal of the resin layer. The reflective coating of walls 22 can then be formed.

Figure 3:
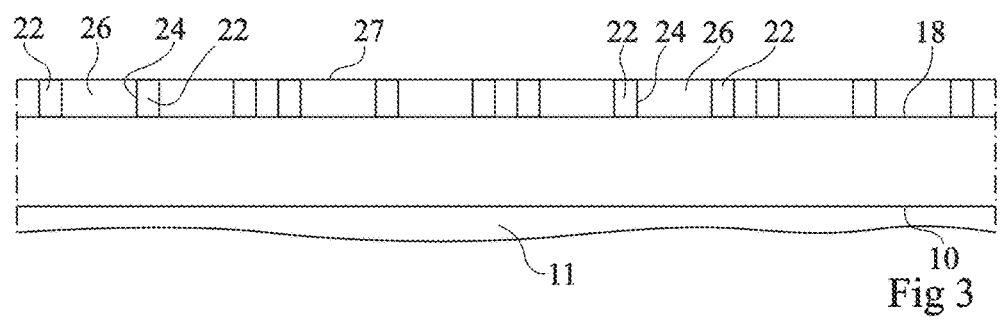
FIG. 3, FIG. 4, and FIG. 5 are side cross-section views, partial and simplified, of structures obtained at other steps of the display screen manufacturing method.

FIG. 3 is a side cross-section view, partial and simplified, of the structure obtained after a step of filling of cavities 24 with a temporary filling material so as to form a temporary block 26 in each cavity 24. Temporary blocks 26 enable in particular to consolidate cavities 24 for subsequent steps of the manufacturing method. According to an embodiment, the temporary filling material is a resist. In FIG. 3, each temporary block 26 is shown as extending from upper surface 18 and stopping at the tops of walls 22. As a variant, the temporary filling material may fill each cavity 24 and form a layer covering walls 22. The presence of temporary blocks 26 enables to obtain display pixels 12 with a substantially planar upper surface 27. According to another embodiment, temporary blocks 26 are not present.

Figure 4:
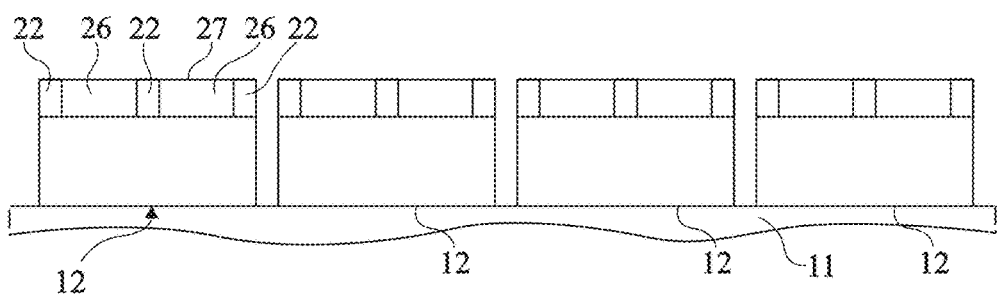

FIG. 4 is a side cross-section view, partial and simplified, of the structure obtained after a step of separation of display pixels 12. The step of separation of display pixels 12 may comprise the cutting of wafer 10 by techniques known in microelectronics, for example by sawing.

Figure 5:
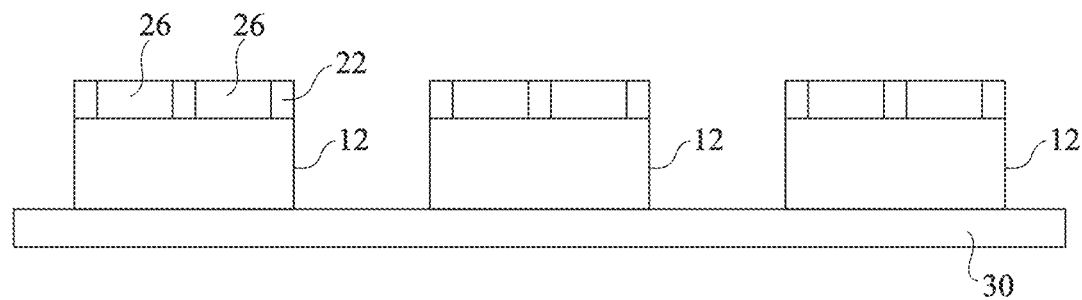
Figure 6:
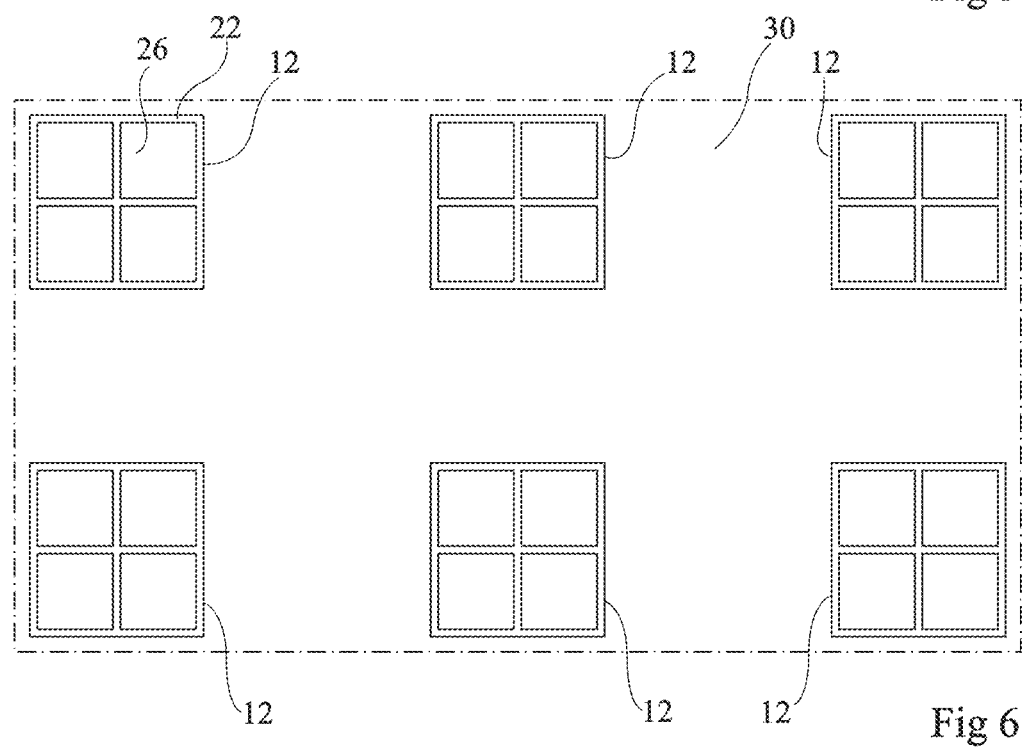
FIG. 6 is a top view, partial and simplified, of the structure of FIG. 5.

FIG. 5 and FIG. 6 respectively are a side cross-section view and a top view, partial and simplified, of the structure obtained after a step of placing of at least part of the display pixels 12 on a support 30, also called slab, of the display screen. According to an embodiment described in further detail hereafter, the method of placing display pixels 12 implements a "pick and place" method in which the display pixels 12 are individually manipulated one after the other to be placed at desired locations on slab 30, for example by using a gripper. According to another embodiment described in more detail hereafter, the method of manipulating display pixels 12 implements a mass transfer method in which a plurality of display pixels 12 are manipulated simultaneously. According to an embodiment, the manipulation of display pixels 12 comprises exerting a mechanical force on the walls 22 and/or on the temporary blocks 26 of the display pixel 12. The presence of temporary blocks 26 advantageously enables to obtain a display pixel 12 having a planar upper surface, which facilitates the use of a gripper.

As an example, each display pixel 12 may be bonded to slab 30 by molecular bonding or via a bonding material, in particular an electrically-conductive epoxy glue.

According to an embodiment, slab 30 comprises connection tracks, not shown, display pixels 12 being bonded to the connection tracks. According to an embodiment, the pitch between display pixels 12 on slab 30 is different from the pitch between the circuits of a display pixel 12 on slab 10.

Figure 7:
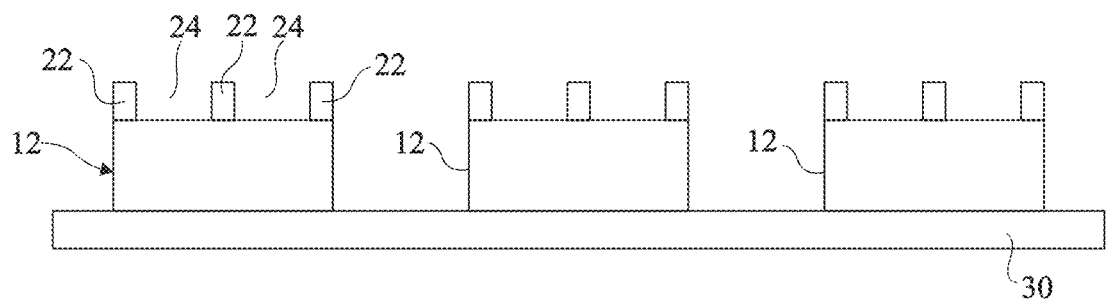
FIG. 7, FIG. 8, and FIG. 9 are side cross-section views, partial and simplified, of structures obtained at other steps of the display screen manufacturing method.

FIG. 7 is a side cross-section view, partial and simplified, of the structure obtained after a step of removal of the temporary blocks 26 present in the cavities 24 of each display pixel 12. The removal of temporary blocks 26 may be carried out by wet etching or dry etching.

Figure 8:
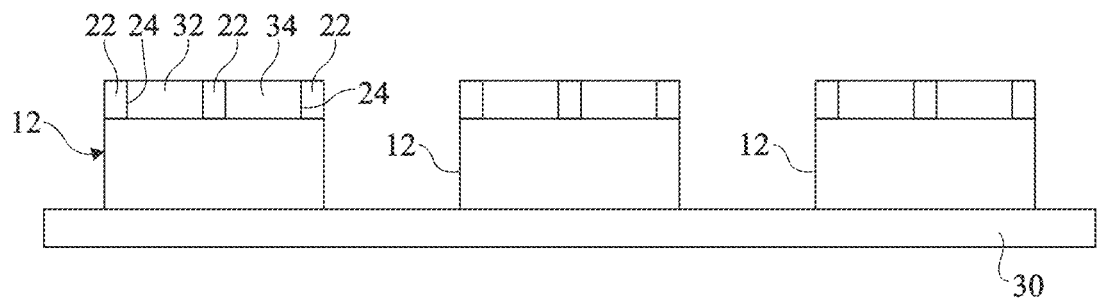

FIG. 8 is a side cross-section view, partial and simplified, of the structure obtained after a step of filling, for each display pixel 12, of at least certain cavities 24 of display pixel 12, preferably of each cavity 24 of display pixel 12, with a final filling material. The final filling material may not be the same for each cavity 24. According to an embodiment, for at least some of the cavities 24 of display pixel 12, the final filling material corresponds, for example, to a photoluminescent material. For at least some of the cavities 24 of display pixel 12, a photoluminescent block 32 is then formed in cavity 24. According to an embodiment, for at least some of the cavities 24 of display pixel 12, the final filling material may correspond, for example, to a non-photoluminescent and transparent material. For at least some of the cavities 24 of display pixel 12, a transparent block 34 is then formed in cavity 24.

In the embodiment previously described in relation with FIGS. 7 and 8, all temporary blocks 26 are removed at the same time and then all photoluminescent blocks 32 and transparent blocks 34 are formed. According to another embodiment, temporary blocks 26 may not all be removed at the same time, but assemblies of temporary blocks 26 may be removed at successive removal steps. A step of removal of an assembly of temporary blocks 26 is then followed by a step of forming of photoluminescent blocks 32 and/or of transparent blocks 34 in at least some of the cavities 24 freed in the previous removal step. A step of removal of another assembly of temporary blocks 26 followed by a step of forming of photoluminescent blocks 32 and/or of transparent blocks 34 in at least some of the freed cavities 24 are then implemented, and so on.

According to an embodiment, each photoluminescent block 32 or transparent block 34 is located opposite one of the light-emitting diodes or a set of light-emitting diodes. Each photoluminescent block 32 comprises luminophores or particles of at least one photoluminescent material adapted, when they are excited by the light emitted by the associated light-emitting diode, to emitting light at a wavelength different from the wavelength of the light emitted by the associated light-emitting diode. According to an embodiment, display pixel 12 comprises at least two types of photoluminescent blocks 32. Each photoluminescent block 32 of the first type is adapted to converting the radiation supplied by the light-emitting diodes that it covers into a first radiation at a first wavelength, and each photoluminescent block 32 of the second type is adapted to converting the radiation supplied by the light-emitting diodes that it covers into a second radiation at a second wavelength. According to an embodiment, the display pixel comprises at least three types of photoluminescent blocks 32, the photoluminescent block of the third type being adapted to converting the radiation supplied by the light-emitting diodes that it covers into a third radiation at a third wavelength. The first, second, and third wavelengths may be different.

According to an embodiment, the light-emitting diodes of pixels 12 are adapted to emitting blue light, that is, a radiation having a wavelength in the range from 430 nm to 490 nm. According to an embodiment, the first wavelength corresponds to green light and is in the range from 510 nm to 570 nm. According to an embodiment, the second wavelength corresponds to red light and is in the range from 600 nm to 720 nm.

According to another embodiment, the light-emitting diodes of pixels 12 are adapted to emitting a radiation in ultraviolet. According to an embodiment, the first wavelength corresponds to blue light and is in the range from 430 nm to 490 nm. According to an embodiment, the second wavelength corresponds to green light and is in the range from 510 nm to 570 nm. According to an embodiment, the third wavelength corresponds to red light and is in the range from 600 nm to 720 nm.

According to an embodiment, each photoluminescent block 32 comprises a matrix in which are dispersed nanometer-range monocrystalline photoluminescent particles of a semiconductor material, also referred to as semiconductor nanocrystals or nanoluminophore particles hereafter. The internal quantum yield $QY_{int}$ of a photoluminescent material is equal to the ratio of the number of emitted photons to the number of photons absorbed by the photoluminescent substance. The internal quantum yield $QY_{int}$ of semiconductor nanocrystals is greater than 5%, preferably greater than 10%, more preferably greater than 20%.

According to an embodiment, the average size of the nanocrystals is in the range from 0.5 nm to 1,000 nm, preferably from 0.5 nm to 500 nm, even more preferably from 1 nm to 100 nm, particularly from 2 nm to 30 nm. For dimensions smaller than 50 nm, the photoconversion properties of semiconductor nanocrystals essentially depend on substantially three-dimensional quantum confinement phenomena. Semiconductor nanocrystals then correspond to quantum dots.

According to an embodiment, the semiconductor material of the semiconductor nanocrystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), cadmium zinc oxide (ZnCdO), cadmium zinc sulfide (CdZnS), cadmium zinc selenide (CdZnSe), indium silver sulfide ($AgInS_2$), perovskites of $PbScX_3$ type, where X is a halogen atom, in particular iodine (I), bromine (Br), or chlorine (Cl), and a mixture of at least two of these compounds. According to an embodiment, the semiconductor material of the semiconductor nanocrystals is selected from the materials cited in Le Blevenec et al.'s publication of Physica Status Solidi (RRL)—Rapid Research Letters Volume 8, No. 4, pages 349-352, April 2014.

According to an embodiment, the dimensions of the semiconductor nanocrystals are selected according to the desired wavelength of the radiation emitted by the semiconductor nanocrystals. As an example, CdSe nanocrystals having an average size in the order of 3.6 nm are adapted to converting blue light into red light, and CdSe nanocrystals having an average size in the order of 1.3 nm are adapted to converting blue light into green light. According to another embodiment, the composition of the semiconductor nanocrystals is selected according to the desired wavelength of the radiation emitted by the semiconductor nanocrystals.

The matrix of photoluminescent blocks 32 is transparent to the radiation emitted by the photoluminescent particles and/or the light emitting diodes, LEDs, preferably by more than 80%. The matrix is, for example, made of silica. The matrix may in particular be made of any at least partially transparent polymer, in particular of silicone, epoxy, acrylic resin of poly(methyl methacrylate) (PMMA) type, or polylactic acid (PLA). The matrix may in particular be made of an at least partially transparent polymer used with three-dimensional printers. The matrix may correspond to a spun-on glass (SOG), photosensitive or non-photosensitive. According to an embodiment, the matrix contains from 2% to 90%, preferably from 10% to 60%, by weight of nanocrystals, for example approximately 30% by weight of nanocrystals. According to an embodiment, transparent blocks 34 only comprise the matrix such as described hereabove.

The thickness of photoluminescent blocks 32 depends on the concentration of nanocrystals and on the type of nanocrystals used. The height of photoluminescent blocks 32 is smaller than or equal to the height of walls 22. In top view, each photoluminescent block 32 may correspond to a square, a rectangle, an "L"-shaped polygon, etc., having an area that may be equal to the area of a square having a side measuring from 1 μm to 100 μm, preferably from 3 μm to 15 μm. The aspect ratio of blocks 32, that is, the ratio of the height to the maximum width of the block, may be in the range from 0.01 to 10, preferably from 0.05 to 2.

Walls 22, which surround photoluminescent blocks 32 and transparent blocks 34, advantageously enable to decrease the optical crosstalk between adjacent display sub-pixels.

According to an embodiment, the filling of cavities 24 with the final filling material is performed by inkjet printing, in particular by electrodynamic jet printing, by aerosol jet printing, or by extrusion printing.

The fact of forming photoluminescent blocks 32 and transparent blocks 34 after the placing of display pixels 12 on slab 30 advantageously enables to be able to select the filling material to be used at a late step of the manufacturing of the optoelectronic device. Further, the steps of manufacturing of display pixels 12 and of placing of display pixels 12 on slab 30 may be common for different types of optoelectronic devices for which the photoluminescent blocks 32 are different.

Another advantage of forming photoluminescent blocks 32 and transparent blocks 34 after the placing of display pixels 12 on slab 30 is that the photoluminescent blocks 32 are not exposed to high temperatures, which may be present in particular on bonding of the display pixels 32 to slab 30.

Another advantage of forming photoluminescent blocks 32 and transparent blocks 34 after the placing of the display pixels 12 on slab 30 is that it is not necessary to provide a protection for photoluminescent blocks 32, which would be necessary if photoluminescent blocks 32 were formed before the separation of display pixels 12 or before the placing of display pixels 12 on slab 30.

Figure 9:
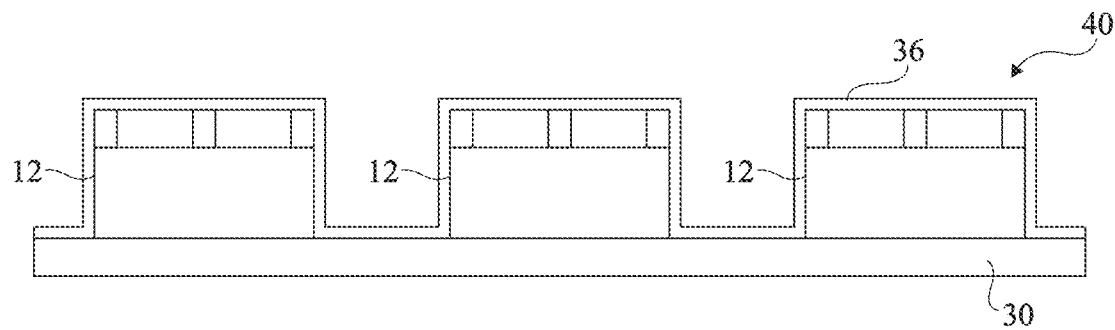

FIG. 9 is a side cross-section view, partial and simplified, of the structure obtained after a step of forming of a protective film 36 on all the display pixels 12 and on the slab 30 between display pixels 12. According to an embodiment, protective film 36 is water- and oxygen-tight. According to an embodiment, protective film 36 is deposited by lamination. A display screen 40 is thus obtained. According to an embodiment, protective film 36 covers the upper surface and the side flanks of each pixel 12 and is in direct physical contact with the upper surface and the side flanks of each pixel 12.

Protective film 36 is transparent to the radiation emitted by photoluminescent blocks 32 and/or the light-emitting diodes. Protective film 36 may be made of an inorganic material transparent to the radiation emitted by the photoluminescent blocks and/or the light-emitting diodes. As an example, the inorganic material is selected from the group comprising silicon oxides, such as $SiO_x$ where x is a real number in the range from 1 to 2, or $SiO_yN_z$ where y and z are real numbers in the range from 0 to 1, titanium oxide, aluminum oxides, for example $Al_2O_3$, and mixtures of these compounds. Protective film 36 may be made of an at least partially transparent organic material. As an example, protective film 36 is a silicone polymer, an epoxide polymer, an acrylic polymer, or a polycarbonate. Protective film 36 may have a single-layer or multilayer structure, comprising, for example, a stack of organic and/or inorganic layers. According to an embodiment, the thickness of protective film 36 is in the range from 10 nm to 1 mm. Protective film 36 may have a multilayer structure with organic and/or inorganic layers.

Figure 10:
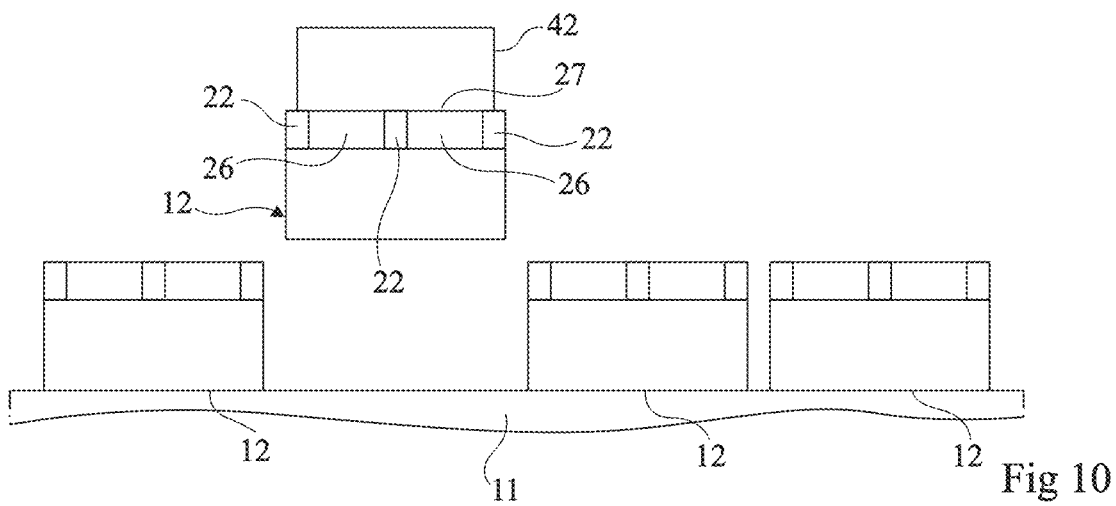
FIG. 10 and FIG. 11 are side cross-section views, partial and simplified, of the structure obtained during a transfer step according to two embodiments.

FIG. 10 is a side cross-section view, partial and simplified, illustrating an embodiment of a method of transfer of display pixels 12 of pick-and-place type. The display pixels 12 obtained after the step of cutting of wafer 10 previously described in relation with FIG. 4 are individually manipulated one after the other to be placed at desired locations on slab 30, not shown in FIG. 10, for example by using a gripper 42.

Figure 11:
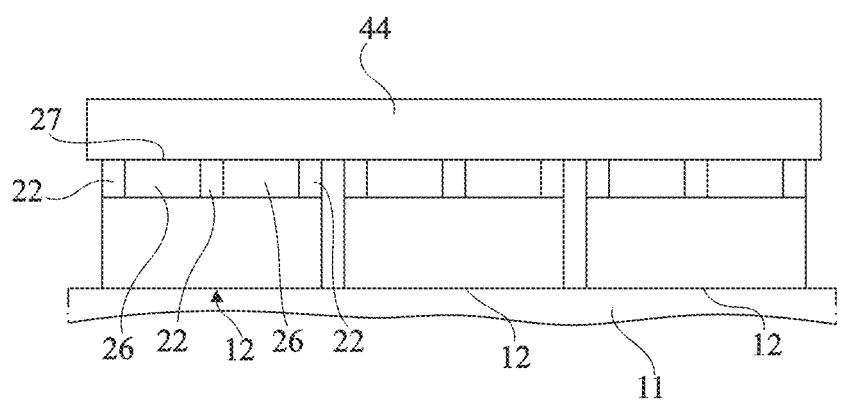

FIG. 11 is a side cross-section view, partial and simplified, illustrating an embodiment of a method of transfer of display pixels 12 of mass transfer type. A plurality of display pixels 12 are simultaneously seized by a gripper 44, for example an elastomer pad, to be placed on slab 30, not shown in FIG. 11.

According to an embodiment, the manipulation of display pixels 12 comprises the exertion of a mechanical force on the walls 22 and/or on the temporary blocks 26 of display pixel 12. The presence of temporary blocks 26 advantageously enables to obtain a display pixel 12 having a substantially planar upper surface 27, which facilitates the use of a gripper. However, as a variant, temporary blocks 26 may not be present. The manipulation of display pixels 12 may then comprise the exertion of a mechanical force only on the walls 22 of display pixel 12.

According to an embodiment, the bonding of display pixel 12 to gripper 42 or of display pixels 12 to gripper 44 may comprise the exertion of a pressure by gripper 42 on the display pixel 12 or by gripper 44 on the display pixels 12, optionally while maintaining gripper 42 or 44 within a given temperature range and/or exposing gripper 42 or 44 to a given radiation. According to an embodiment, the separation of display pixel 12 from gripper 42 or of display pixels 12 from gripper 44 may comprise the exertion of a traction on gripper 42 or 44, optionally while maintaining gripper 42 or 44 within a given temperature range and/or exposing gripper 42 or 44 to a given radiation.

Figure 12:
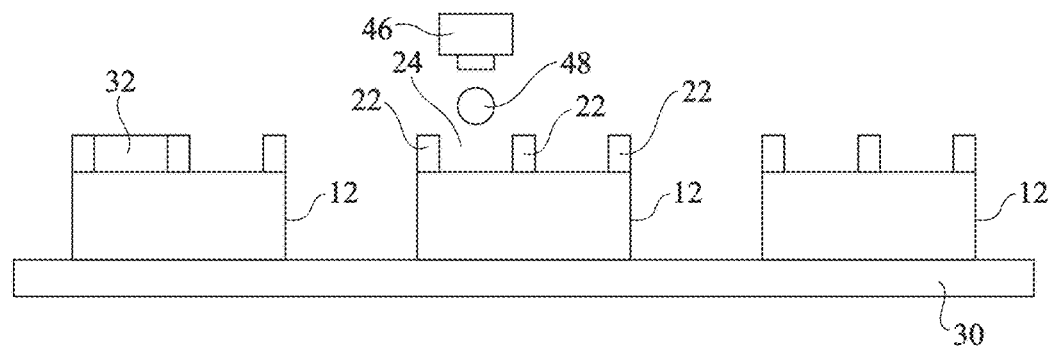
FIG. 12 is a side cross-section view, partial and simplified, of the structure during a cavity-filling step.

FIG. 12 is a side cross-section view, partial and simplified, illustrating an embodiment of a method of forming photoluminescent blocks 32 and transparent blocks 34 by inkjet printing. According to an embodiment, a print head 46 of an inkjet printer is displaced to come vertically in line with each cavity 24 intended to contain a photoluminescent block 32 so as to eject a drop 48 or drops of the final filling material into cavity 24 to fill cavity 24 with the final filling material.

Figure 13:
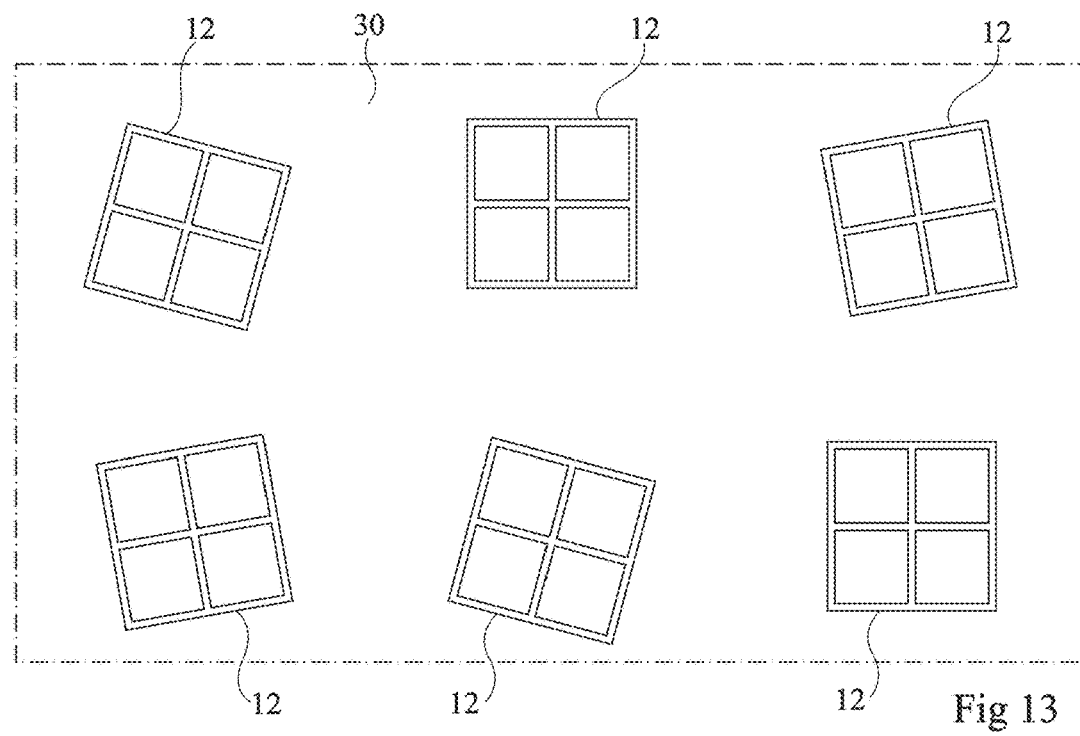
FIG. 13 is a top view, partial and simplified, of a display screen illustrating a mispositioning of the display pixels.

FIG. 13 is a view similar to FIG. 6, illustrating a configuration in which at least some of the display pixels 12 are arranged on slab 30 in a position and/or according to an orientation which are not exactly the desired ideal position and/or orientation. Advantageously, the methods of filling cavities 24 are adapted to compensating for deviations between the actual position and/or orientation of the display pixel 12 and the desired ideal position and/or orientation. As an example, an inkjet printer comprises a guiding system configured to adjust the position of print head 46 to take into account a deviation between the actual position and/or orientation of display pixel 12 and the desired ideal position and/or orientation of display pixel 12 so that drop 48 or the drops are correctly ejected into cavity 24.

An advantage of forming walls 22 before the step of transfer of the display pixel circuits onto slab 30 is that it makes the forming of walls 22 by manufacturing steps comprising photolithography steps easier, since display pixels 12 have not undergone a transfer yet and are thus correctly aligned on wafer 10. Indeed, the transfer induces potential misalignments or positioning rotations which make the implementation of photolithography steps to form walls 22 impossible, complex, or imprecise since having to take into account multiple degrees of error. As an example, the creation of a mask to form walls 22 after the transfer will have to take into account all the errors that can be seen in the example of FIG. 13, and the design of display pixels 12 will have to be reviewed as a whole to be able to adapt, obviously requiring, for a same useful emissive surface area, larger display pixels and a greater quantity of material to form the walls.

According to an embodiment, each display pixel 12 comprises at least one light-emitting diode. According to an embodiment, each display pixel 12 comprises light-emitting diodes formed from nanometer- or micrometer-range three-dimensional elements, in particular microwires, nanowires, or pyramids.

The term "microwire" or "nanowire" designates a three-dimensional structure elongated along a preferred direction, at least two dimensions of which, called minor dimensions, are in the range from 5 nm to 5 µm, preferably from 100 nm to 2 µm, more preferably from 200 nm to 1.5 µm, the third dimension, called major dimension or height, being greater than or equal to 1 time, preferably greater than or equal to 3 times, and even more preferably greater than or equal to 5 times, the largest of the minor dimensions. In certain embodiments, the height of each microfilm or nanowire may be greater than or equal to 500 nm, preferably in the range from 1 µm to 50 µm. In the rest of the description, the term "wire" is used to signify "microwire or nanowire".

The cross-section of the wires may have various shapes, for example, oval, circular or polygonal, in particular triangular, rectangular, square or hexagonal. It will be understood that the term "average diameter" used in connection with a cross-section of a wire designates a quantity associated with the area of the wire in this cross-section, corresponding, for example, to the diameter of the disk having the same area as the cross-section of the wire.

In the rest of the description, the term pyramid designates a three-dimensional structure, a portion of which has a pyramidal or elongated conical shape. This pyramidal structure may be truncated, that is, the top of the cone is absent, leaving a plateau. The base of the pyramid is inscribed within a square having a side dimension in the range from 100 nm to 10 µm, preferably from 0.2 µm to 2 µm. The polygon forming the base of the pyramid may be a hexagon. The height of the pyramid between the base of the pyramid and the apex or the summit plateau varies from 100 nm to 20 µm, preferably between 200 nm and 2 µm.

In the rest of the description, embodiments will be described in the case of a display pixel 12 with light-emitting diodes comprising microwires or nanowires. However, it should be clear that these embodiments may concern a display pixel with light-emitting diodes comprising micrometer- or nanometer-range pyramids.

The wires predominantly comprise, preferably by more than 60% by mass, more preferably more than 80% by mass, at least one semiconductor material. The semiconductor material may be silicon, germanium, silicon carbide, a III-V compound, a II-VI compound, or a combination of at least two of these compounds.

Examples of group III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions. Examples of group-II elements include group-IIA elements, for example beryllium (Be) and magnesium (Mg), and group-IIB elements, particularly zinc (Zn), cadmium (Cd), and mercury (Hg). Examples of group-VI elements include group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions. The semiconductor material of the wires may comprise a dopant, for example silicon ensuring an N-type doping of a III-N compound, or magnesium ensuring a P-type doping of a III-N compound.

Figure 14:
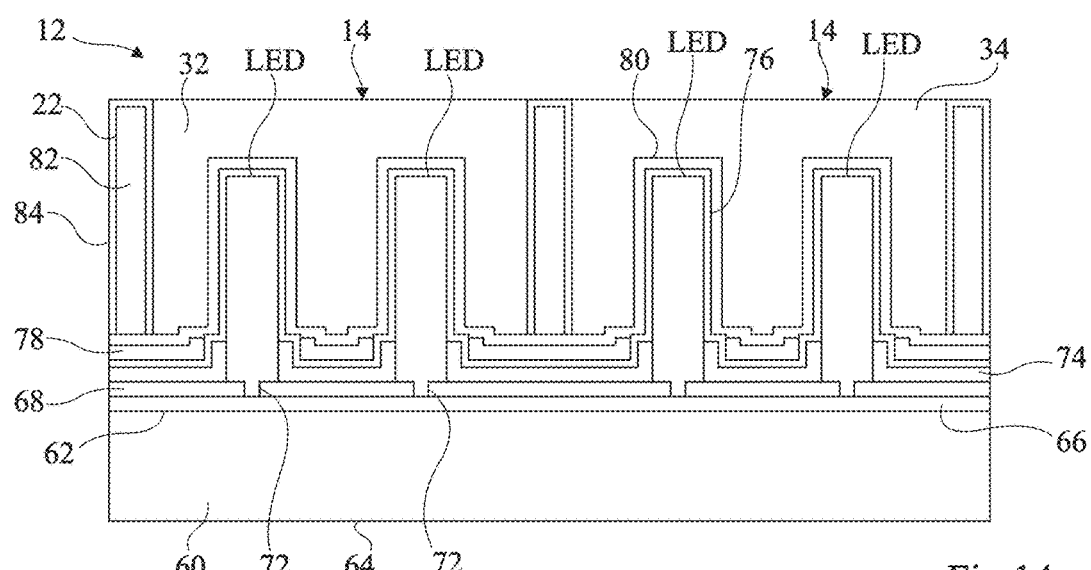
FIG. 14 is a cross-section view, partial and simplified, of an embodiment of an optoelectronic device comprising light-emitting diodes and photoluminescent blocks.

FIG. 14 is a cross-section view, partial and simplified, of a more detailed embodiment of display pixel 12 in the case of a display pixel 12 with light-emitting diodes comprising nanowires or microwires. Display pixel 12 comprises, from bottom to top in FIG. 14:

- a substrate 60 comprising opposite surfaces 62 and 64, upper surface 62 preferably being planar at least at the location of the light-emitting diodes;
- a seed layer 66 made of a material favoring wire growth and arranged on surface 62;
- an insulating layer 68 covering seed layer 66 and comprising openings 72 exposing portions of seed layer 66;
- light-emitting diodes LED (four light-emitting diodes being shown), each light-emitting diode being in contact with seed layer 66 through one of openings 72;
- an insulating layer 74 extending over the side flanks of a lower portion of each light-emitting diode LED and extending over the insulating layer 68 between light-emitting diodes LED;
- a layer 76 forming an electrode covering each light-emitting diode LED and further extending over insulating layer 74 between light-emitting diodes LED;
- a conductive and reflective layer 78 extending over layer 76 between light-emitting diodes LED, where conductive layer 78 may as a variant be interposed between electrode layer 76 and insulating layer 74 between light-emitting diodes LED;
- a dielectric protection layer 80 extending over layers 76 and 78;
- photoluminescent blocks 32 covering certain assemblies of light-emitting diodes, a single photoluminescent block 32 being shown as an example in FIG. 14;
- blocks 34 transparent to the radiation emitted by the light-emitting diodes and covering other assemblies of light-emitting diodes, it being possible for the transparent blocks 34 not to be present, a single transparent block 34 being shown as an example in FIG. 14; and
- walls 22 around blocks 32, 34, each wall 22 here comprising a core 82 surrounded by a reflective coating 84.

Figure 15:
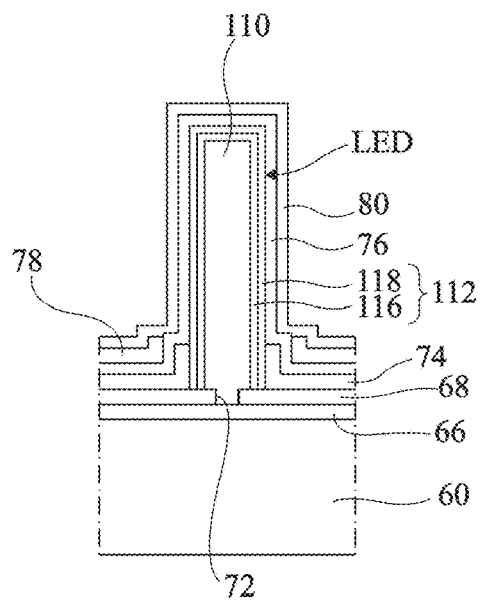
FIG. 15, FIG. 16, and FIG. 17 are cross-section views, partial and simplified, of a light-emitting diode.

FIG. 15 shows an embodiment of light-emitting diodes LED in which each light-emitting diode LED comprises a wire 110 in contact with seed layer 66 through one of openings 72, and a shell 112 comprising a stack of semiconductor layers covering the side walls and the top of wire 110. Such a configuration is said to be radial. The assembly formed by each wire 110 and the associated shell 112 forms light-emitting diode LED. According to another embodiment, seed layer 66 may be replaced by seed pads, for example formed at the bottom of openings 72.

Shell 112 may comprise a stack of a plurality of layers, comprising in particular an active layer 116 and a bonding layer 118. Active layer 116 is the layer from which is emitted most of, preferably all, the radiation supplied by light-emitting diode LED. According to an example, active layer 116 may comprise confinement means, such as a single quantum well or multiple quantum wells. Bonding layer 118 may comprise a stack of semiconductor layers of the same III-V material as wire 110, but of a conductivity type opposite to wire 110.

Figure 16:
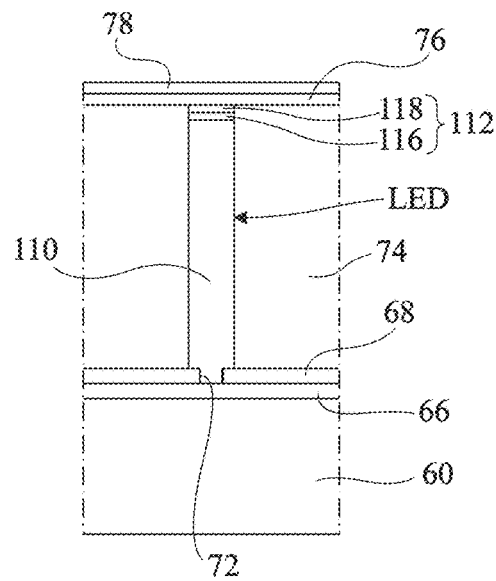

FIG. 16 shows another embodiment of light-emitting diodes LED. The light-emitting diode LED shown in FIG. 16 comprises all the elements of the light-emitting diode LED shown in FIG. 15, with the difference that shell 112 is present only at the top of wire 110. Such a configuration is said to be axial.

The forming of light-emitting diodes LED, that is, the growth of wires 110 in openings 72, and the forming of the shells 112 covering wires 110 can be achieved, for example, by metal-organic chemical vapor deposition (MOCVD) or any other adapted method.

Substrate 60 may correspond to a monoblock structure or correspond to a layer covering a support made of another material. Substrate 60 is preferably a semiconductor substrate, for example a substrate made of silicon, germanium, silicon carbide, of a III-V compound, such as GaN or GaAs, or a ZnO substrate. Preferably, substrate 60 is a single-crystal silicon substrate. Substrate 60 may correspond to a multilayer structure of silicon-on-insulator type, also known as SOI.

Seed layer 66 is made of a material favoring wire growth. As an example, the material forming seed layer 66 may be a nitride, a carbide, or a boride of a transition metal from column IV, V, or VI of the periodic table of elements, or a combination of these compounds. According to another embodiment, seed layer 66 may not be present.

Each insulating layer 68, 74, 80 may be made of a dielectric material, for example of silicon oxide ($SiO_2$), of silicon nitride ($Si_xN_y$, where x is approximately equal to 3 and y is approximately equal to 4, for example $Si_3N_4$), of silicon oxynitride (in particular of general formula $SiO_xN_y$, for example $Si_2ON_2$), of aluminum oxide ($Al_2O_3$), of hafnium oxide ($HfO_2$), of titanium dioxide ($TiO_2$), or of diamond. Each insulating layer 68, 74, 80 may have a single-layer structure or correspond to a stack of two or more than two layers.

Electrode layer 76 is adapted to letting through the electromagnetic radiation emitted by the light-emitting diodes. The material forming electrode layer 76 may be a transparent and conductive material such as indium tin oxide (ITO), or aluminum or gallium zinc oxide. The thickness of electrode layer 76 may be in the range from 0.01 μm to 1 μm.

Conductive layer 78 preferably corresponds to a metal layer, for example made of aluminum, of silver, of copper, of gold, or of zinc. The thickness of conductive layer 78 may be in the range from 0.01 μm to 10 μm.

Figure 17:
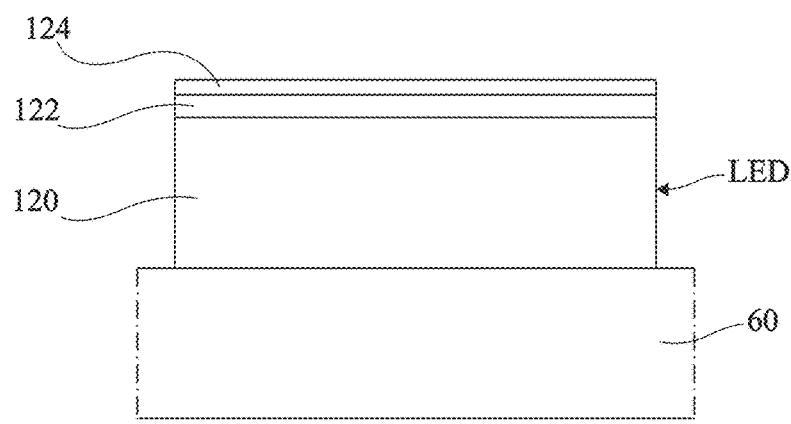

FIG. 17 shows another embodiment of light-emitting diodes LED. The light-emitting diode LED shown in FIG. 17 has a two-dimensional structure in that it is manufactured by the forming of a stack of substantially planar semiconductor layers on substrate 60 followed by the delimitation of the light-emitting diode, for example by etching of trenches in the stack of semiconductor layers. The light-emitting diode shown in FIG. 17 comprises a doped semiconductor layer 120 of a first conductivity type, covered by an active layer 122, itself covered by a doped semiconductor layer 124 of a second conductivity type.

Various embodiments and variants have been described. Those skilled in the art will understand that certain features of these various embodiments and variants could be combined, and other variants will become apparent to those skilled in the art.

Finally, the practical implementation of the described embodiments and variants is within the abilities of those skilled in the art, based on the functional indications given hereabove.

The invention claimed is:

1. Method of manufacturing an optoelectronic device comprising the following steps, in the order:
    a) manufacturing display pixel circuits, each comprising an emission surface, and on said surface, walls delimiting at least one cavity;
    b) bonding said display pixel circuits to a support; and
    c) filling said at least one cavity of each display pixel circuit with a first filling material to form a first color conversion module.

2. Method according to claim 1, wherein said first filling material comprises quantum dots.

3. Method according to claim 1, comprising, after step c), the step of forming of a protective film completely covering each display pixel circuit and said support between said display pixel circuits.

4. Method according to claim 1, wherein step a) comprises the forming of a plurality of copies of said display pixel circuit on a wafer and the cutting of said wafer to separate said display pixel circuits.

5. Method according to claim 4, wherein, at step a), the forming of said walls comprises photolithography steps.

6. Method according to claim 4, comprising, at step a), the filling of said cavities with a second filling material and, after step b) and before step c), the removal of said second filling material from said cavities.

7. Method according to claim 1, wherein, at step c), the filling of said at least one cavity of each display pixel circuit with said first filling material is performed by inkjet printing, by aerosol jet printing, or by extrusion printing.

8. Method according to claim 1, wherein, at step a), said walls delimit at least three cavities for each display pixel circuit.

9. Method according to claim 1, wherein said walls delimit at least two cavities for each display pixel circuit, and wherein step c) comprises the filling of at least one of the cavities of each display pixel circuit with a third filling material, different from said first filling material, to form a second color conversion module in said cavity.

10. Method according to claim 1, wherein the ratio of the height to the thickness of said walls is in the range from 0.5 to 50.

11. Method according to claim 1, comprising, at step a), the forming of light-emitting diodes for each display pixel circuit.

12. Method according to claim 4, wherein said support comprises a slab provided with electrical connection tracks, the method comprising, at step b), the transfer of said display pixel circuits onto said slab, said display pixel circuits being bonded to said electrical connection tracks, the pitch between said display pixel circuits on said slab being different from the pitch between said display pixel circuits on said wafer.

13. Method according to claim 1, wherein said optoelectronic device is a display screen.

* * * * *